United States Patent
Ye et al.

(10) Patent No.: US 7,746,016 B2
(45) Date of Patent: Jun. 29, 2010

(54) FAN CONTROLLER

(75) Inventors: Zhen-Xing Ye, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 320 days.

(21) Appl. No.: 11/858,913

(22) Filed: Sep. 21, 2007

(65) Prior Publication Data

US 2008/0106228 A1     May 8, 2008

(30) Foreign Application Priority Data

Nov. 3, 2006   (CN) .................... 2006 1 0201064

(51) Int. Cl.
    $H02P\ 7/00$     (2006.01)
(52) U.S. Cl. .............. 318/479; 318/484; 318/472; 318/473
(58) Field of Classification Search .......... 318/479, 318/445, 452, 471, 472, 473, 484
See application file for complete search history.

(56) References Cited

U.S. PATENT DOCUMENTS

| | | | | |
|---|---|---|---|---|
| 5,526,289 | A | 6/1996 | Dinh et al. | |
| 6,135,718 | A * | 10/2000 | Yang | 417/22 |
| 6,265,790 | B1 * | 7/2001 | Vogman | 307/64 |
| 6,400,045 | B1 | 6/2002 | Hosokawa et al. | |
| 6,617,815 | B1 | 9/2003 | Krief | |
| 7,008,061 | B2 * | 3/2006 | Yano | 353/57 |
| 7,492,112 | B2 * | 2/2009 | Huang et al. | 318/283 |
| 2009/0184584 | A1 * | 7/2009 | Hermann et al. | 307/80 |

FOREIGN PATENT DOCUMENTS

| | | |
|---|---|---|
| CN | 1470971 A | 1/2004 |
| CN | 2723741 Y | 9/2005 |

* cited by examiner

*Primary Examiner*—Bentsu Ro
*Assistant Examiner*—Thai Dinh
(74) *Attorney, Agent, or Firm*—Frank R. Niranjan

(57) ABSTRACT

A fan controller includes an input module and an output module. The input module is used for receiving a power supply signal from a power supply which is used for providing power to a fan, and outputting a trigger signal when the power supply signal when the power supply turns off. The output module is used for providing power for the fan when the power supply turns off. The output module includes a timer circuit and an integrator circuit. The timer circuit is coupled to the input module, and is used for receiving the trigger signal, and providing the power for the fan according to the trigger signal for a predetermined amount of time. The integrator circuit is used for providing a threshold voltage for the timer circuit, the threshold voltage tripping termination of the power provided by the timer circuit.

17 Claims, 2 Drawing Sheets

FAN CONTROLLER

BACKGROUND

1. Field of the Invention

The present invention relates to a fan controller.

2. Description of Related Art

Various electronic devices, such as personal computers and media players, generate heat during use. Accordingly, the electronic devices must be cooled to prevent overheating. Fans are often incorporated as heat dissipating means. Commonly, the fans are powered by the electronic devices, when the electronic devices are turned off, so are the fans. Thus, any heat remaining will not be readily dissipated. Accordingly, components in the electronic devices may become overheated after the electronic devices are powered off; this shortens life of the components.

Therefore, a need exists in the industry to provide a fan controller for powering a fan after an electronic device has been powered down.

SUMMARY

In one embodiment, a fan controller includes an input module and an output module. The input module is used for receiving a power supply signal from a power supply which is used for providing power to a fan, and outputting a trigger signal when the power supply signal when the power supply turns off. The output module is used for providing power for the fan when the power supply turns off. The output module includes a timer circuit and an integrator circuit. The timer circuit is coupled to the input module, and is used for receiving the trigger signal, and providing the power for the fan according to the trigger signal for a predetermined amount of time. The integrator circuit is used for providing a threshold voltage for the timer circuit, the threshold voltage tripping termination of the power provided by the timer circuit.

Other advantages and novel features of the present fan controller will become more apparent from the following detailed description of preferred embodiment when taken in conjunction with the accompanying drawings, in which:

DETAILED DESCRIPTION

Figure 1:
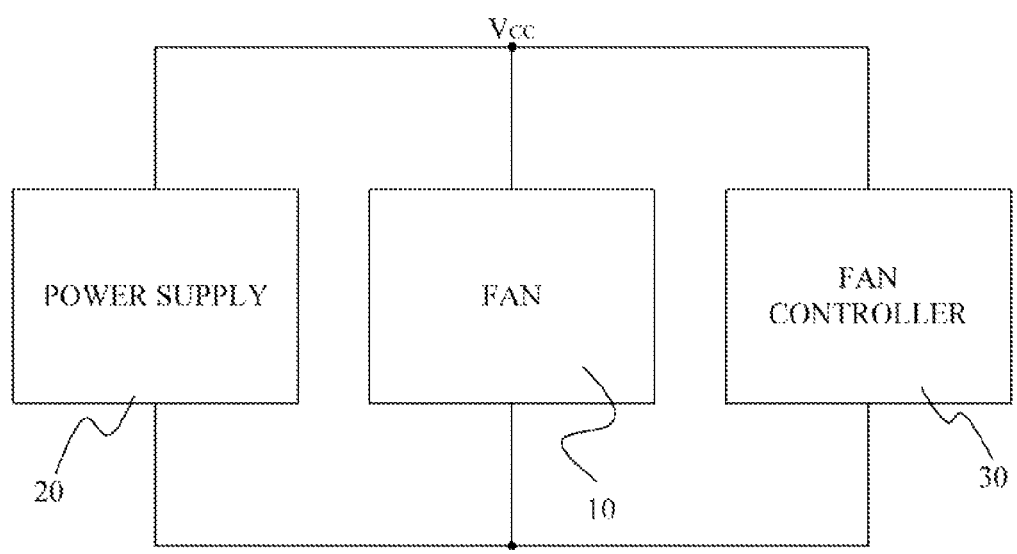
FIG. 1 is a block diagram of an electronic device incorporating a fan controller in accordance with an exemplary embodiment.

Referring to FIG. 1, an electronic device includes a fan 10, a power supply 20, and a fan controller 30.

The fan 10 acts as a heat dissipating means for the electronic device, for dissipating heat generated by components of the electronic device, such as CPUs and chipsets.

The power supply 20 is coupled to the fan 10, for providing power to the fan 10 when the electronic device is turned on. When the electronic device is turned off, the power supply 20 is also turned off.

The fan controller 30 is also coupled to the fan 10, and provides power to the fan 10 when the power supply 20 is turned off.

Figure 2:
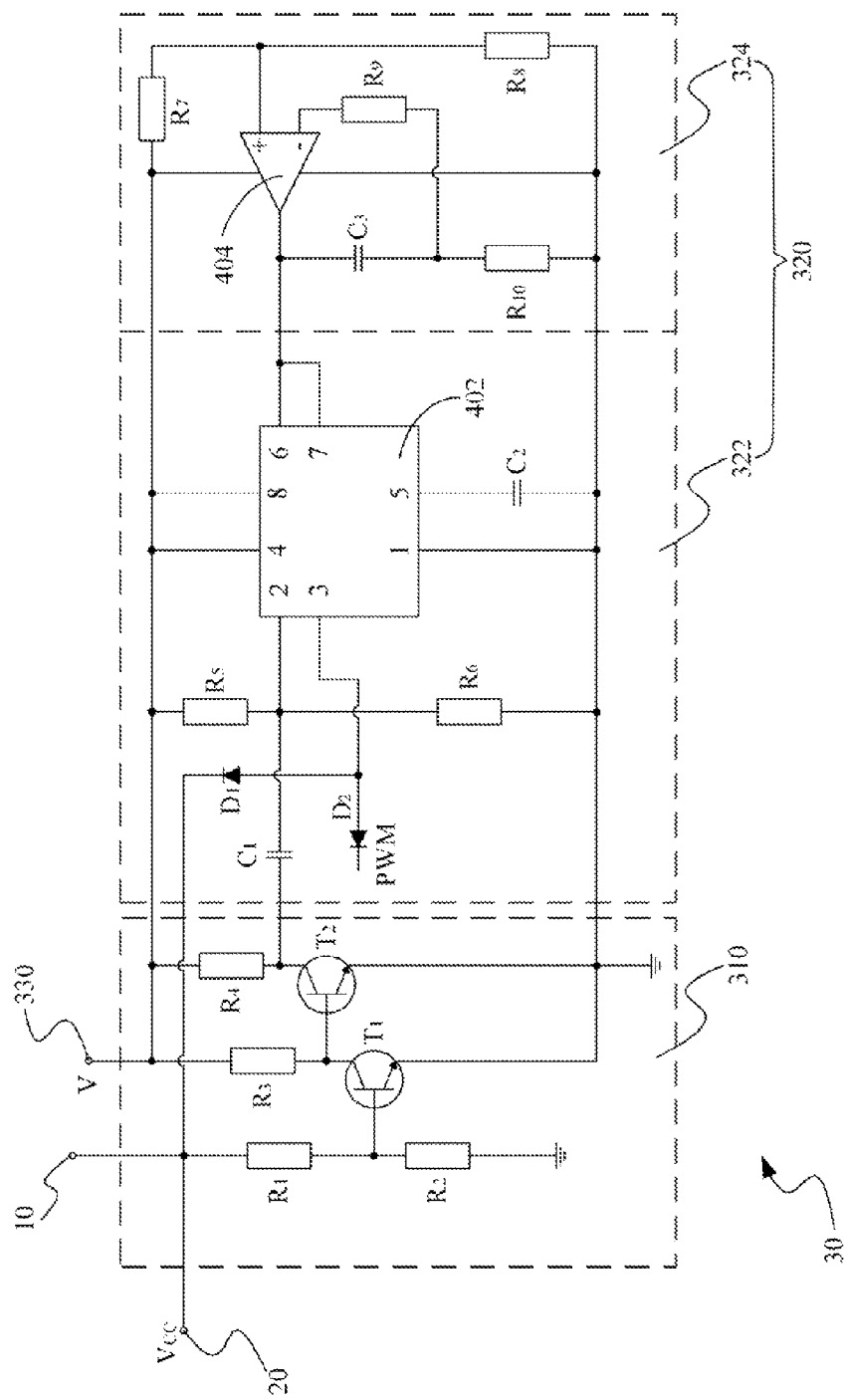
FIG. 2 is a schematic circuit diagram of the fan controller of FIG. 1.

Referring also to FIG. 2, a schematic circuit diagram of the fan controller 30 of FIG. 1 is illustrated. The fan controller 30 includes an input module 310, an output module 320, and a power module 330.

The input module 310 includes four resistors $R_1$, $R_2$, $R_3$, $R_4$, and two switch units $T_1$ and $T_2$.

The resistors $R_1$ and $R_2$ are connected in series between the power supply 20 and ground.

In the embodiment, the two switch units $T_1$ and $T_2$ are bipolar junction transistors (BJT), each having a base, a collector, and an emitter.

The base of the switch unit $T_1$ is connected to a node between the two resistors $R_1$ and $R_2$. The collector of the switch unit $T_1$ is connected to the power module 330 through the resistor $R_3$. The emitter of the switch unit $T_1$ is connected to ground.

The base of the switch unit $T_2$ is connected to the collector of the switch unit $T_1$. The collector of the switch unit $T_2$ is connected to the power module 330 through the resistor $R_4$. The emitter of the switch unit $T_2$ is connected to ground.

The output module 320 includes a timer circuit 322 and an integrator circuit 324. The timer circuit 322 includes a timer chip 402, two resistors $R_5$, $R_6$, two capacitors $C_1$, $C_2$, and two diodes $D_1$, $D_2$.

In the embodiment, the timer chip 402 is an NE555 chip, with 8 pins having functions listed below:

TABLE 1

| Pin No. | Function |
| --- | --- |
| 1 | GND |
| 2 | Trigger |
| 3 | Output |
| 4 | Reset |
| 5 | Control Voltage |
| 6 | Threshold |
| 7 | Discharge |
| 8 | $V_{CC}$ |

Pin 1 of the timer chip 402 is connected to ground. Pin 5 of the timer chip 402 is coupled to ground through the capacitor $C_2$. Pin 2 of the timer chip 402 is coupled to the collector of the switch unit $T_2$ through the capacitor $C_1$. Pins 4 and 8 of the timer chip 402 are connected to the power module 330. Pins 6 and 7 of the timer chip 402 are connected to the integrator circuit 324. Pin 3 of the timer chip 402 is connected to a power supply terminal of the fan 10 through the diode $D_1$.

The integrator circuit 324 includes an operational amplifier 404, four resistors $R_7$, $R_8$, $R_9$, $R_{10}$, and a capacitor $C_3$.

The resistors $R_7$ and $R_8$ are connected in series between the power module 330 and node between the resistors $R_7$ and $R_8$. An inverting input terminal of the operational amplifier 404 is connected to ground through the two resistors $R_9$ and $R_{10}$ that are connected in series. An output terminal of the operational amplifier 404 is connected to the pins 6 and 7 of the timer chip 402. The output of the operational amplifier 404 is also fed back to a node between the resistors $R_9$ and $R_{10}$ through the capacitor $C_3$. As an embodiment, the operational amplifier is an LMC6464.

A working principle of the fan controller is described below. In the embodiment, the resistors $R_1$ and $R_2$ respectively have resistances of about 7K Ohms and 5K Ohms. If the electronic device is turned on, the power supply 20 provides voltage to the input module 310 of the fan controller 30, e.g. 12V. The switch unit $T_1$ is conductive due to the node between the resistors $R_1$ and $R_2$ having a voltage level of 5V. Therefore, the switch unit $T_2$ is not conductive, because the base of the switch unit $T_2$ has a low voltage level from the collector of the switch unit $T_1$. The input module 310 thus outputs a high voltage signal to the output module 320 through the collector of the switch unit $T_2$.

The high voltage level of the output end of the input module 310 charges the capacitor $C_1$, therefore the pin 2 of the timer chip 402 is shifted to a high level. The pin 3 of the timer chip 402 thus outputs a low voltage through the diode $D_2$. At this point, the power module 330 does not provide power to the fan 10. The pin 7 of the timer chip 402 also has a high voltage, thus the timer circuit 322 provides a high voltage to the integrator circuit 324, and the integrator circuit 324 is made inactive.

If the electronic device is turned off, the power supply 20 no longer provides power to the fan 10, and the input module 310 does not receive a power voltage from the power supply 20. The switch unit $T_1$ does not conduct, so the collector of the switch unit $T_1$, which is connected to the base of the switch unit $T_2$, has a high voltage. Accordingly, the switch unit $T_2$ is conductive, and its collector, which is connected to the timer circuit 322 of the output module 320, has a low voltage level.

The low voltage level at the collector of the switch unit $T_2$ allows the capacitor $C_1$ to discharge, which makes the voltage on the pin 2 of the timer chip 402 go low. The falling edge of the voltage signal on the pin 2 of the timer chip 402 triggers the pin 3 of the timer chip 402 to output a high voltage, which powers the fan 10. At this point, the power module 330 provides power to the fan 10.

The pin 7 of the timer chip 402 has a low voltage according to the low voltage on the pin 2, which activates the integrator circuit 324. In the embodiment, the two resistors $R_7$, $R_8$ respectively have resistances of about 100K Ohms and 680 Ohms, the power module 330 provides a voltage of 6V. The non-inverting input terminal of the operational amplifier 404 has a voltage of about 0.04V, which is calculated by:

$$\frac{0.68K}{100K + 0.68K} \times 6\,\text{V} \approx 0.04 \text{ V}.$$

In the timer chip 402, the pin 6 has a threshold voltage, which is 4V, ⅔ of the voltage provided by the power module 310. Therefore, an integration cycle of the integrator circuit 324 is calculated by:

$$\frac{4\,\text{V}}{0.04\,\text{V}} \times R \times C = 100\ RC,$$

wherein R refers to a resistance of the resistor $R_{10}$, which is 10K Ohms in the embodiment, and C refers to a capacitance of the capacitor $C_3$, which is 100 μF in the embodiment. Thus the integration cycle of the integrator circuit 324 is set at 100 seconds.

When the pin 3 of the timer chip 402 has output a high voltage to the fan 10 for 100 seconds, the output terminal of the operational amplifier 404, which is connected to the pin 6 of the timer chip 402, reaches the threshold voltage of 4V. The timer chip 402 is reset accordingly, and the pin 3 of the timer chip 402 no longer outputs a high voltage, which means that the fan controller 30 no longer provides power to the fan 10.

Obviously, in other embodiments, the integration cycle of the integrator circuit 324 can be set to other values by selectively coupling resistors and/or capacitors with different resistances and/or capacitances. The switch units $T_1$, $T_2$ may be replaced by other components with switch functions, such as Field Effect Transistors (FET), or Insulated Gate Bipolar Transistors (IGBT).

The electronic device utilizes the fan controller to provide power to the fan for a predetermined amount of time after the electronic device is turned off, so that the fan can dissipate any remaining excess heat. Therefore, overheating of the components in the electronic device is avoided, and life of the components and the electronic device is prolonged.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A fan controller comprising:
   an input module for receiving a power supply signal from a power supply which is configured to provide power to a fan, and outputting a trigger signal when the power supply signal indicates the power supply turns off; and
   an output module for providing power to the fan when the power supply turns off, the output module comprising:
   a timer circuit coupled to the input module, for receiving the trigger signal, and providing the power to the fan according to the trigger signal; and
   an integrator circuit for providing a threshold voltage for the timer circuit, the threshold voltage tripping termination of the power provided by the timer circuit.

2. The fan controller as described in claim 1, wherein the integrator circuit provides the threshold voltage after the timer circuit provides the power for a predetermined time.

3. The fan controller as described in claim 1, wherein the input module comprises:
   two first resistors connected in series between the power supply and ground;
   a first switch unit connected to an node between the two first resistors; and
   a second switch unit connected to the first switch unit, the second switch unit having an output terminal coupled to the timer circuit, wherein when the power supply turns off, the first switch unit turns off and the second switch unit turns on such that the output terminal of the second switch unit outputs the trigger signal to the timer circuit.

4. The fan controller as described in claim 3, wherein the first and second switch units are bipolar junction transistors.

5. The fan controller as described in claim 4, wherein the first and second switch units each have a base, a collector, and an emitter; the base of the first switch unit is connected to the node between the two first resistors, the base of the second switch unit is connected to the collector of the first switch unit; the collectors of the first and second switch units are respectively connected to a power module through a second resistor; and the emitters of the first and second switch units are respectively connected to ground, the collector of the second switch unit being coupled to the timer circuit via a capacitor.

6. The fan controller as described in claim 5, wherein the power module is a battery.

7. An electronic device comprising:
a fan for dissipating heat;
a power supply for providing power to the fan;
a fan controller for providing power to the fan at the occurrence that the power supply is turned off, the fan controller comprising:
an input module for detecting the power provided by the power supply; and
an output module for providing power to the fan at the occurrence that the detection of the input module indicates that the power supply is turned off, the output module comprising:
a timer circuit for providing the power to the fan according to the detection of the input module; and
an integrator circuit for providing a threshold voltage for the timer circuit, the threshold voltage tripping termination of the power provided by the timer circuit.

8. The electronic device as described in claim 7, wherein the input module comprises:
two first resistors connected in series between the power supply and ground;
a first switch unit connected to an node between the two first resistors, for outputting a first signal; and
a second switch unit connected to the first switch unit and the output module, for outputting a trigger signal to the output module when the first signal controls the second switch unit to be conductive.

9. The electronic device as described in claim 8, wherein the output module provides power to the fan according to the trigger signal.

10. The electronic device as described in claim 7, wherein the integrator circuit provides the threshold voltage after the timer circuit provides the power for a predetermined time.

11. The electronic device as described in claim 7, wherein the fan controller further comprises a power module for providing power to the input module and the output module.

12. The electronic device as described in claim 11, wherein the integrator circuit comprises an operational amplifier having an inverting input terminal, a non-inverting input terminal, and an output terminal; the non-inverting input terminal is connected to a node between two second resistors connected in series between the power module and ground; the output terminal is coupled to ground through a capacitor and a third resistor; the inverting input terminal is connected to a node between the capacitor and the third resistor through a fourth resistor.

13. The electronic device as claimed in claim 7, wherein the timer circuit comprises a timer chip having a threshold input pin, the threshold input pin being coupled to the integrator circuit, for receiving the threshold voltage; the timer chip is reset according to the threshold voltage.

14. The electronic device as claimed in claim 13, wherein the timer chip further comprises a trigger pin coupled to the input module and an output pin coupled to the fan for outputting power to the fan at the occurrence that the power supply is turned off.

15. A method for controlling a fan comprising steps of:
detecting a first power supply of the fan;
providing a second power supply to the fan at the absence of the first power supply;
sustaining the second power supply for a predetermined time, wherein the predetermined time is determined by an integrator circuit which is configured to output a threshold voltage to a threshold input pin of a timer circuit to reset the timer circuit; and
terminating the second power supply.

16. The method as claimed in claim 15, wherein the second power supply is provided to the fan via the timer circuit.

17. The method as claimed in claim 15, wherein the first power supply is detected by two switch circuits.

* * * * *